(12) United States Patent
Wu et al.

(10) Patent No.: US 10,350,869 B2
(45) Date of Patent: Jul. 16, 2019

(54) FINGERPRINT IDENTIFICATION MODULE AND METHOD FOR MANUFACTURING THE SAME

(71) Applicant: SHENZHEN GOODIX TECHNOLOGY CO., LTD., Shenzhen, Guangdong (CN)

(72) Inventors: Baoquan Wu, Guangdong (CN); Wei Long, Guangdong (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 96 days.

(21) Appl. No.: 15/674,724

(22) Filed: Aug. 11, 2017

(65) Prior Publication Data
US 2018/0015711 A1    Jan. 18, 2018

Related U.S. Application Data

(63) Continuation of application No. PCT/CN2016/090101, filed on Jul. 15, 2016.

(51) Int. Cl.
*G06K 9/20* (2006.01)
*B32B 37/12* (2006.01)
(Continued)

(52) U.S. Cl.
CPC ........ *B32B 37/1284* (2013.01); *G06K 9/0002* (2013.01); *G06K 9/00013* (2013.01);
(Continued)

(58) Field of Classification Search
CPC .................................................. G06K 9/0002
See application file for complete search history.

(56) References Cited

U.S. PATENT DOCUMENTS

| 5,546,654 A | * | 8/1996 | Wojnarowski | ......... | H05K 3/284 |
| | | | | | 279/3 |
| 2015/0137347 A1 | * | 5/2015 | Nakako | ...................... | C09J 1/00 |
| | | | | | 257/734 |
| 2016/0239699 A1 | * | 8/2016 | Chang | .................. | G06K 9/0002 |

FOREIGN PATENT DOCUMENTS

CN    103198547 A    7/2013
CN    104916549 A    9/2015
(Continued)

OTHER PUBLICATIONS

State Intellectual Property Office of the P.R. China (ISR/CN), "International Search Report for PCT/CN2016/090101", China, dated Mar. 17, 2017.

*Primary Examiner* — Brian Werner
(74) *Attorney, Agent, or Firm* — Heslin Rothenberg Farley & Mesiti P.C.

(57) ABSTRACT

The present disclosure discloses a fingerprint identification module and a method for manufacturing the same, and relates to the field of fingerprint identification technologies. The fingerprint identification module is obtained by dicing a board-level module, and includes a fingerprint identification chip, a filling material, a color coating and a cover. The color coating is disposed between the filling material and the cover, and the fingerprint identification chip is inversely attached in a hollow area of the filling material in a vacuum environment. The fingerprint identification module has a simple structure and is easy to manufacture. By using the method, the bubbles between the fingerprint identification chip and the cover are effectively eliminated, and the manufacture efficiency of the fingerprint identification module is improved.

9 Claims, 5 Drawing Sheets

(51) Int. Cl.
  *G06K 9/00*    (2006.01)
  *H01L 21/50*    (2006.01)
  *H01L 23/00*    (2006.01)
  *B32B 37/00*    (2006.01)
  *B32B 37/06*    (2006.01)
  *B32B 37/10*    (2006.01)
  *B32B 38/00*    (2006.01)
  *H01L 23/31*    (2006.01)

(52) U.S. Cl.
  CPC .......... *G06K 9/00053* (2013.01); *H01L 21/50* (2013.01); *H01L 24/92* (2013.01); *B32B 37/003* (2013.01); *B32B 37/06* (2013.01); *B32B 37/10* (2013.01); *B32B 38/0004* (2013.01); *B32B 2305/72* (2013.01); *B32B 2457/00* (2013.01); *H01L 23/3121* (2013.01); *H01L 24/45* (2013.01); *H01L 24/48* (2013.01); *H01L 2224/45144* (2013.01); *H01L 2224/48091* (2013.01); *H01L 2924/181* (2013.01)

(56) References Cited

FOREIGN PATENT DOCUMENTS

| | | | |
|---|---|---|---|
| CN | 105046244 A | 11/2015 | |
| CN | 105068685 A | 11/2015 | |

\* cited by examiner

FINGERPRINT IDENTIFICATION MODULE AND METHOD FOR MANUFACTURING THE SAME

CROSS-REFERENCE TO RELATED APPLICATIONS

The present application is a continuation of international application No. PCT/CN2016/090101, filed on Jul. 15, 2016, which is incorporated herein by reference in its entirety.

TECHNICAL FIELD

The present disclosure relates to the technical filed of fingerprint identification, and in particular, relates to a fingerprint identification module and a method for manufacturing the same.

BACKGROUND

In the prior art, the manufacture of a fingerprint identification module includes at least the following three processes:

Referring to FIG. 2, a fingerprint identification chip 100 is firstly soldered to a flexible printed circuit (FPC) 300 by using the surface mount technology (SMT). Referring to FIG. 3, a metal ring 400 is subsequently attached to the FPC 300. Referring to FIG. 4, a glass cover 500 is finally attached on the surface of the fingerprint identification chip 100.

Referring to FIG. 4, such a manufacture process causes the attachment of the glass cover 500 and the fingerprint identification chip 100 to be simply subject to influences of the metal ring and the FPC, causes bubbles to be remained between the glass cover 500 and the fingerprint identification chip 100, and further affects the entire performance of the fingerprint identification module. In addition, such a manufacture process imposes a high requirement on an operation precision of the soldering and attachment, which objectively affects the efficiency of the production.

A Chinese patent application titled "FINGERPRINT IDENTIFICATION MODULE AND METHOD FOR MANUFACTURING THE SAME, AND ELECTRONIC DEVICE HAVING THE FINGERPRINT IDENTIFICATION MODULE" (publication No. CN 105046244 A) discloses a fingerprint identification module, a method for manufacturing the same, and an electronic device having the same. The fingerprint identification module includes a laminated structure and a support element. The support element wraps the laminated structure; and the laminated structure includes a cover, a fingerprint identification chip disposed under the cover, a FPC disposed under the fingerprint identification chip and electrically connected to the fingerprint identification chip, and a reinforcement plate disposed under the FPC. An attach surface of the fingerprint identification module features flatness, smoothness and good tactility during the touch, and the sensing effect of the fingerprint identification chip may be better.

The manufacturing method includes the following steps: (1) placing in a mould the laminated structure in which the reinforcement plate, the FPC, the fingerprint identification chip and the cover are disposed from bottom to top; and (2) injecting a glue into the mould to enable the glue to wrap the laminated structure, solidifying the glue to form the support element, and subsequently demoulding, such that the fingerprint identification module is obtained; where the fingerprint identification chip is electrically connected to the FPC. By using this method, the fingerprint identification module having a smooth attach surface may be quickly and effectively manufactured, and the transmission effect of signals of the acquired fingerprint identification module is good, which effectively reduces electromagnetic filed loss caused by a rough attach surface, and improves the transmission effect of signals is improved. In addition, the support element is formed via injecting the glue and solidifying the glue, which effectively reduces the thickness of the fingerprint identification module. Further, by using the method for manufacturing the fingerprint identification module according to the embodiments of the present disclosure, the grinding is not required, the operation steps are simplified, and manpower and material resources are saved.

To sum up, this fingerprint identification module has a compact structure, and a high integration. However, the laminated structure of the fingerprint identification module is relatively complex, and according to the manufacturing method, the bubbles are easily remained between the glass cover 500 and the fingerprint identification chip 100. Therefore, the entire performance of the fingerprint identification module may be affected.

SUMMARY

To effectively eliminate bubbles between a fingerprint identification chip and a cover, and improve the manufacture efficiency of fingerprint identification modules, a fingerprint identification module and a method for manufacturing the same according to the present disclosure employ the following technical solutions.

A fingerprint identification module is provided. The fingerprint identification module is obtained by dicing a board-level module, and includes a fingerprint identification chip, a filling material, a color coating and a cover.

The color coating is disposed between the filling material and the cover, and the fingerprint identification chip is inversely attached in a hollow area of the filling material in a vacuum environment.

Further, the fingerprint identification chip includes an identification area, an interconnection gold thread, a molding layer, a substrate layer and a pad.

The identification area is disposed inside of the molding layer, the substrate layer is adhered to the molding layer, the pad is disposed on an upper surface and a lower surface of the substrate layer and is further disposed on an upper surface of the identification area, and the pad on the upper surface of the identification area is connected to the pad on the upper surface of the substrate layer via the interconnection gold thread.

Further, an upper surface of the inversely-attached fingerprint identification chip is above an upper surface of the filling material.

Further, the filling material is an organic colloid, a film or a plastic, and has a photo-induced effect.

The hollow area is obtained by exposing and developing a part of the filling material. Further, the cover is a strip-type glass, a strip-type ceramic, a substrate-type glass, a substrate-type ceramic, or a disc-type glass having the same shape as a wafer.

A method for manufacturing a fingerprint identification module is provided. The method includes:

manufacturing a board-level module using a filling material, a color coating and a cover, and processing an array of hollow areas in a predetermined quantity on the filling material of the board-level module;

attaching a fingerprint identification chip into each hollow area in the array of hollow areas of the filling material in a vacuum environment; and dicing the board-level module to obtain fingerprint identification modules.

Further, the attaching a fingerprint identification chip into each hollow area in the array of hollow areas of the filling material includes:

uniformly filling a glue with a preset thickness at a bottom of each of the hollow areas, and performing a defoaming process for the glue;

inversely placing the fingerprint identification chip in each hollow area in the array of hollow areas of the filling material; and pressurizing the fingerprint identification chip and heating to cure the fingerprint identification chip, such that the fingerprint identification chip is tightly attached to the glue and the glue is solidified.

Further, an upper surface of the inversely-placed fingerprint identification chip is above an upper surface of the filling material.

Further, the filling material is an organic colloid, a film or a plastic, and has a photo-induced effect; and each hollow area in the array of hollow areas of the filling material is obtained by exposing and developing the filling material.

Further, the cover is a strip-type glass, a strip-type ceramic, a substrate-type glass, a substrate-type ceramic, or a disc-type glass having the same shape as a wafer.

Compared with the prior art, the present disclosure has the following beneficial effects:

1. The fingerprint identification module according to the embodiments of the present disclosure is obtained by dicing a board-level module, and includes a fingerprint identification chip, a filling material, a color coating and a cover. The color coating is disposed between the filling material and the cover, and the fingerprint identification chip is inversely attached in a hollow area of the filling material in a vacuum environment. This fingerprint identification module has a simple structure, and is easy to manufacture.

2. The method for manufacturing the fingerprint identification module according to the embodiments of the present disclosure includes the following steps: manufacturing a board-level module using a filling material, a color coating and a cover, where the filling material includes an array of hollow areas; respectively attaching a plurality of fingerprint identification chips into each hollow area in the array of hollow areas of the filling material in a vacuum environment; and dicing the board-level module to obtain a plurality of fingerprint identification modules. The method effectively eliminates bubbles between the fingerprint identification chip and the cover, and improves the manufacture efficiency of the fingerprint identification module.

Figure 1:
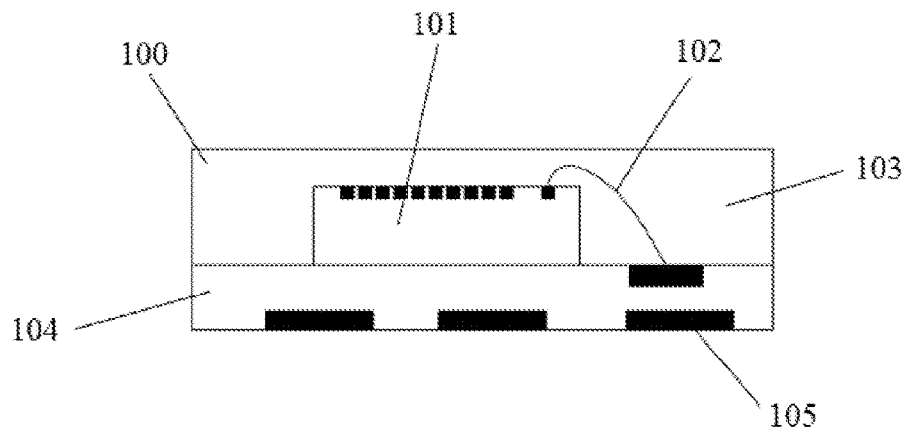
FIG. 1 is a schematic structural diagram of a fingerprint identification chip according to an embodiment of the present disclosure.
Figure 2:
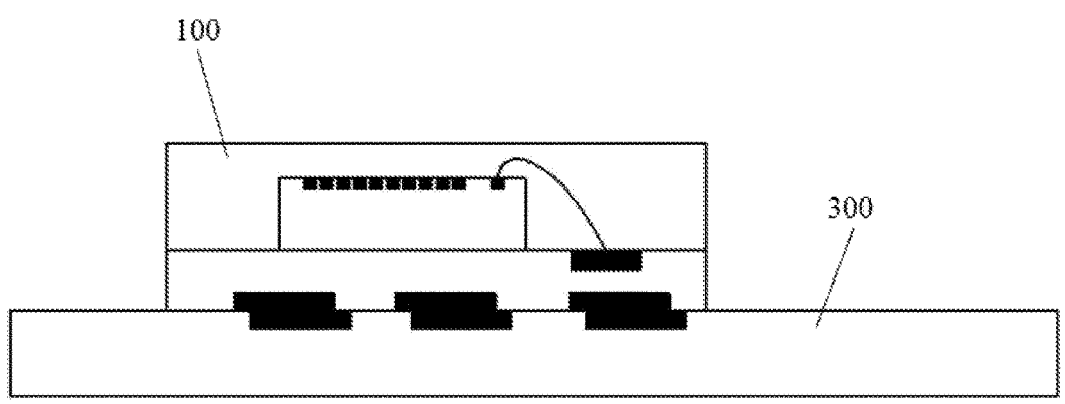
FIG. 2 is a schematic diagram of an attaching process of a fingerprint identification chip and a flexible printed circuit in the prior art.
Figure 3:
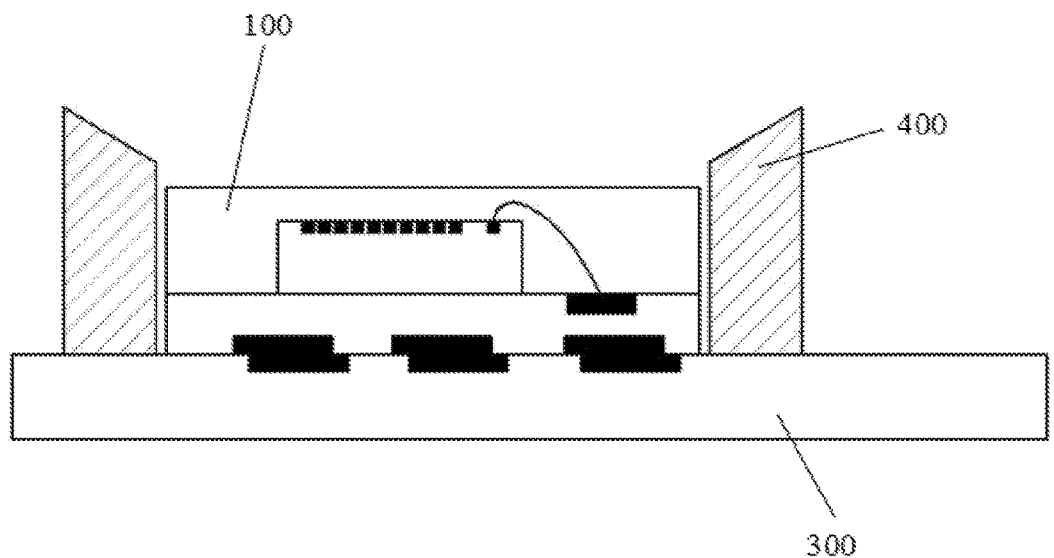
FIG. 3 is a schematic diagram of an attaching process of a metal ring and a flexible printed circuit in the prior art.
Figure 4:
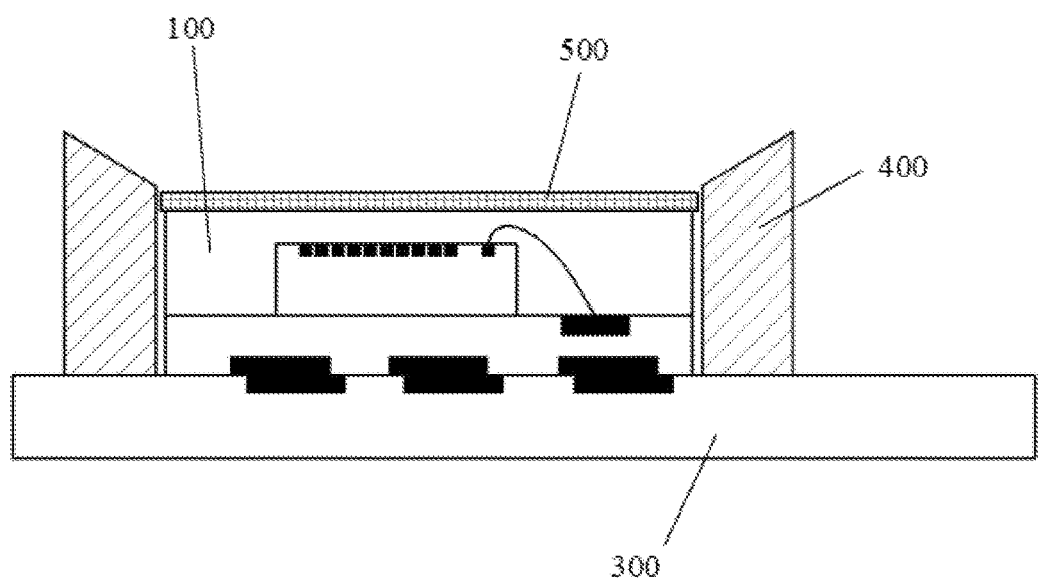
FIG. 4 is a schematic diagram of an attaching process of a glass cover and a flexible printed circuit in the prior art.

Reference numerals and denotations thereof: 100—fingerprint identification chip, 101—identification area, 102—interconnection gold thread, 103—molding layer, 104—substrate layer, 105—pad, 200—fingerprint identification module, 201—filling material, 202—color coating, 203—cover, 204—glue layer, 300—flexible printed circuit, 400—metal ring, and 500—glass cover.

DETAILED DESCRIPTION

In order to facilitate understanding of the present disclosure, the present disclosure will be described more comprehensively with reference to relevant drawings. The accompanying drawings show preferential embodiments of the present disclosure. However, the present disclosure may be implemented in a plurality of forms or ways, and is not limited to the embodiments described herein. On the contrary, these embodiments are provided to make the understanding of the disclosed contents of the present disclosure more thorough and comprehensive.

Unless otherwise defined, all the technical and scientific terms used in this specification are the same as those usually understood by persons skilled in the art of the present disclosure. The terms in the specification of the present disclosure are only used to describe the specific embodiments, but not to limit the present disclosure.

Referring to FIG. 1, a fingerprint identification chip 100 included in a fingerprint identification module provided in the embodiments of the present disclosure includes an identification area 101, an interconnection gold thread 102, a molding layer 103, a substrate layer 104 and a pad 105. The identification area 101 is disposed inside of the molding layer 103, the substrate layer 104 is adhered to the molding layer 103, the pad 105 is disposed on an upper surface and a lower surface of the substrate layer 104 and is further disposed on an upper surface of the identification area 101, and the pad 105 on the upper surface of the identification area 101 is connected to the pad 105 on the upper surface of the substrate layer 104 via the interconnection gold thread 102.

Figure 5:
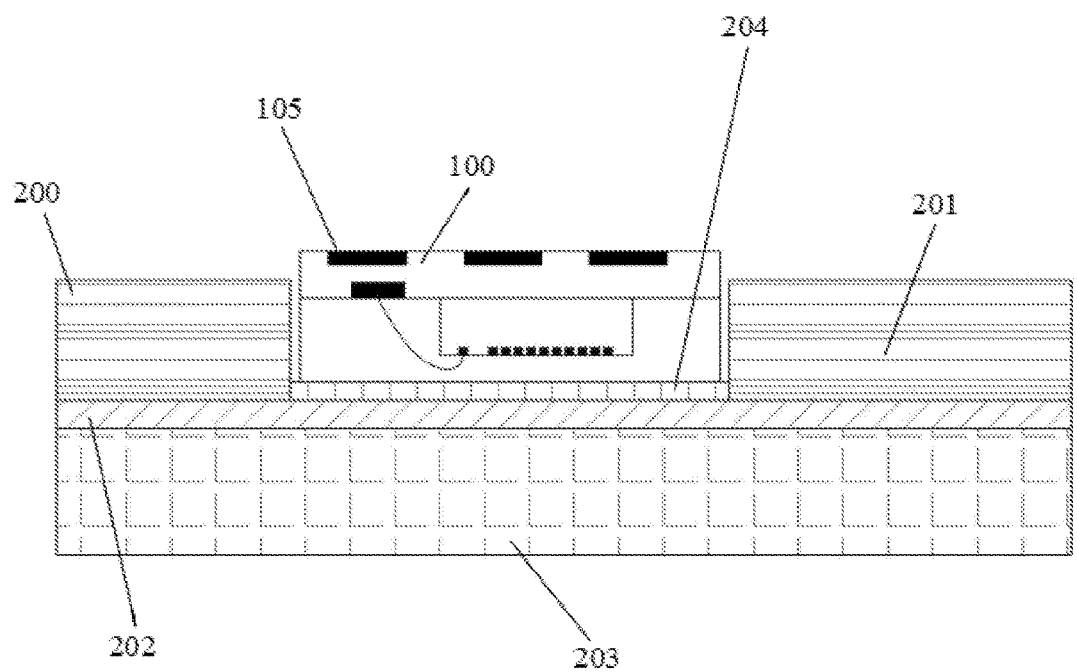
FIG. 5 is a schematic structural diagram of a fingerprint identification module according to an embodiment of the present disclosure.

Referring to FIG. 5, a fingerprint identification module provided in the embodiments of the present disclosure includes a fingerprint identification chip 100, a filling material 201, a color coating 202, a cover 203 and a glue layer 204. The color coating 202 is disposed between the filling material 201 and the cover 203, and the fingerprint identification chip 100 is inversely attached in a hollow area of the filling material 201 in a vacuum environment. The filling material 201 is a material having a photo-induced effect such as an organic colloid, a film or a plastic. The hollow area is obtained by exposing and developing a part of the filling material 201. The hollow area is filled with the glue layer 204, which is configured to attach the fingerprint identification chip 100. The fingerprint identification module is manufactured in batches on a board-level module, and is subsequently obtained via dicing. The structure is simple and easy to manufacture.

A method for manufacturing for a fingerprint identification module provided in the embodiments of the present disclosure includes the following steps.

Step S1: A board-level module is manufactured by using a filling material 201, a color coating 202 and a cover 203.

Figure 6:
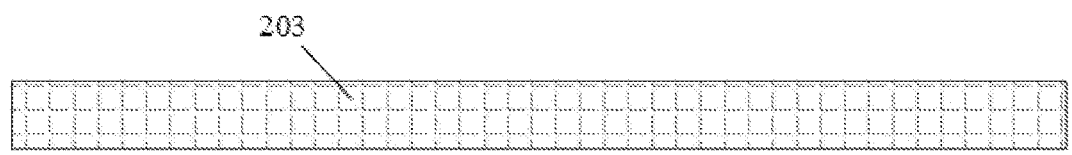
FIG. 6 is a schematic diagram of a cover of the fingerprint identification module according to an embodiment of the present disclosure.
Figure 7:
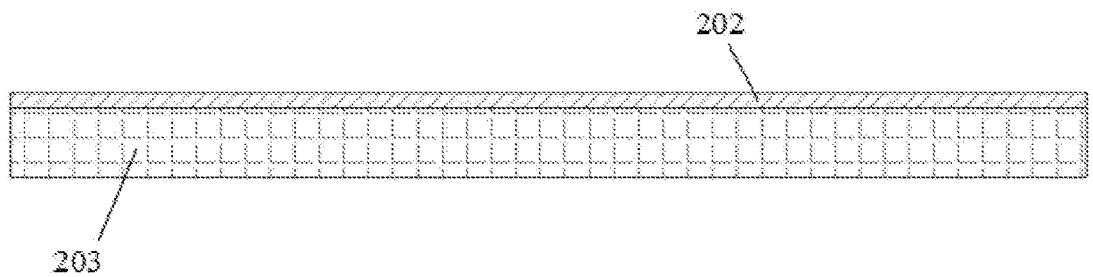
FIG. 7 is a schematic diagram of a cover and a color coating of the fingerprint identification module according to an embodiment of the present disclosure.

Referring to FIG. 6, the cover 203 is used as a carrier, and may use such materials as a strip-type glass, a strip-type ceramic, a substrate-type glass, a substrate-type ceramic, or a disc-type glass having the same shape as a wafer. Different sizes may be selected for the cover 203 according to the features of the industry or the wafer level module technology. Referring to FIG. 7, the color coating 202 may be coated on the cover 203 by using such processes as silk screening, and a specific color may be customized according to customer's needs.

Figure 8:
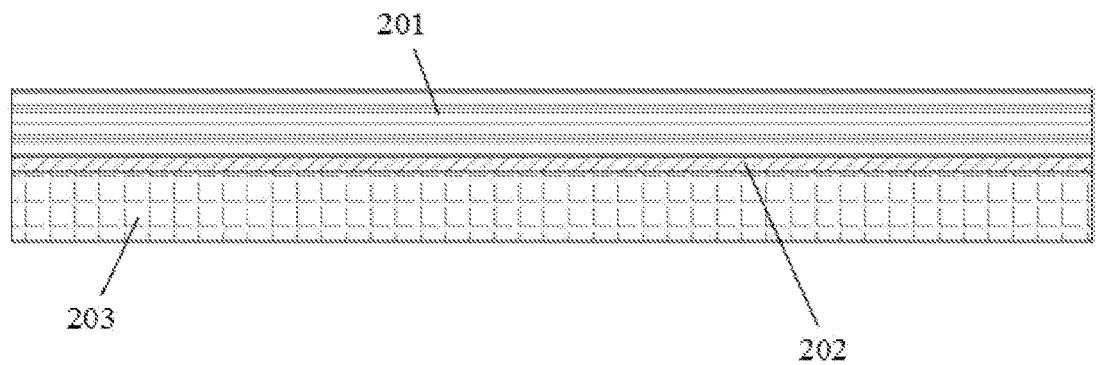
FIG. 8 is a schematic diagram of a board-level module according to an embodiment of the present disclosure.

Referring to FIG. 8, a layer of the filling material 201 is coated on the color coating 202, the filling material 201 may be a material having a photo-induced effect such as an organic colloid, a film or a plastic, and the thickness of the filling material is customized according to the thickness of the fingerprint identification chip 100.

Step S2: An array of hollow areas in a predetermined quantity is processed on the filling material 201 of the board-level module.

Figure 9:
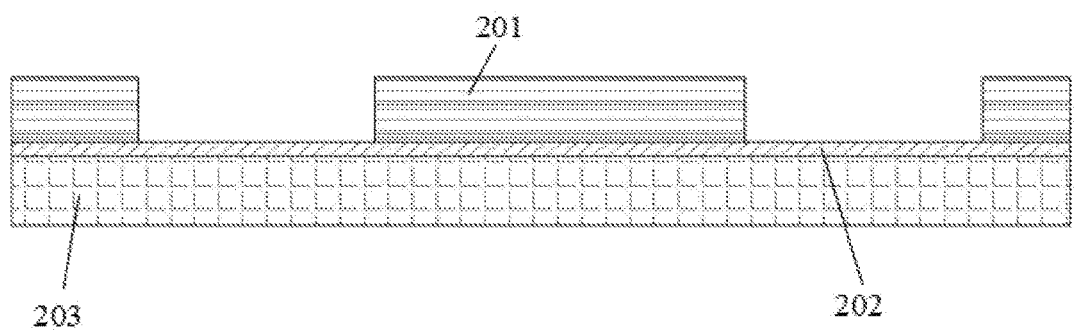
FIG. 9 is a schematic diagram of a hollow area of a board-level module according to an embodiment of the present disclosure.

Referring to FIG. 9, with respect to step S2, since the filling material 201 has the photo-induced effect, the hollow area may be acquired by a photolithography process such as, exposing and developing the filling material 201. After the filling material 201 is hollowed, the size of each hollow area is a little bit greater than that of the fingerprint identification chip 100, and the filling material 201 may surround and support the fingerprint identification chip 100, and thus protect the fingerprint identification chip 100. A plurality of hollow area arrays may be manufactured on the filling material 201 of the same board-level module for manufacturing of the fingerprint identification module, such that the materials and processes are reduced, and the production efficiency is improved.

Step S3: The fingerprint identification chip 100 is attached into each hollow area in the array of hollow areas of the filling material in a vacuum environment.

In step S3, the attaching a fingerprint identification chip 100 into each hollow area in the array of hollow areas of the filling material 201 includes the following steps.

S31: A glue with a preset thickness is uniformly filled at a bottom of each of the hollow areas, and a defoaming process is performed for the glue.

Figure 10:
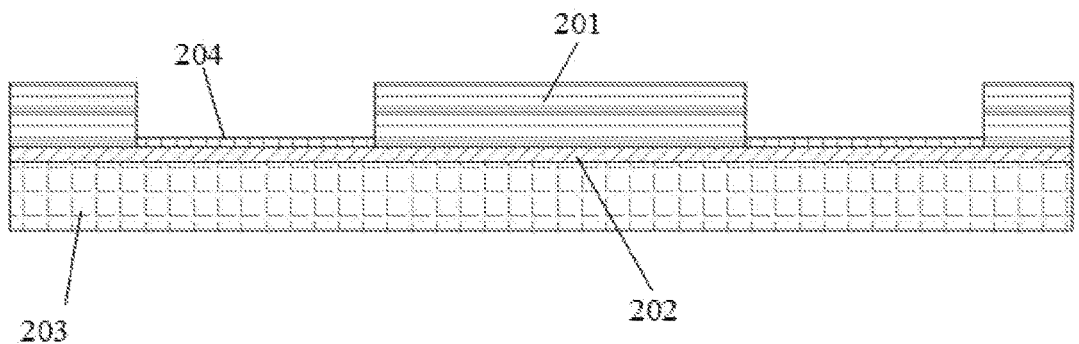
FIG. 10 is a schematic diagram of glue filling of the board-level module according to an embodiment of the present disclosure.

Referring to FIG. 10, the bottom of each of the hollow areas is coated by the glue layer 204, such that the glue with a suitable thickness is uniformly filled at the bottom of the hollow area. In addition, the defoaming process is performed for the glue layer 204 to eliminate the bubbles.

S32: The fingerprint identification chip 100 is inversely placed in each hollow area in the array of hollow areas of the filling material 201.

The manufactured board-level module is placed in a vacuum environment, and the atmospheric environment that exists in the hollow area is cleared. In addition, the fingerprint identification chip 100 is inversely placed in the hollow area, and an upper surface of the inversely-placed fingerprint identification chip 100 is above an upper surface of the filling material 201.

S33: The fingerprint identification chip 100 is pressurized and heated, such that the fingerprint identification chip 100 is tightly attached to the glue and the glue is solidified.

Figure 11:
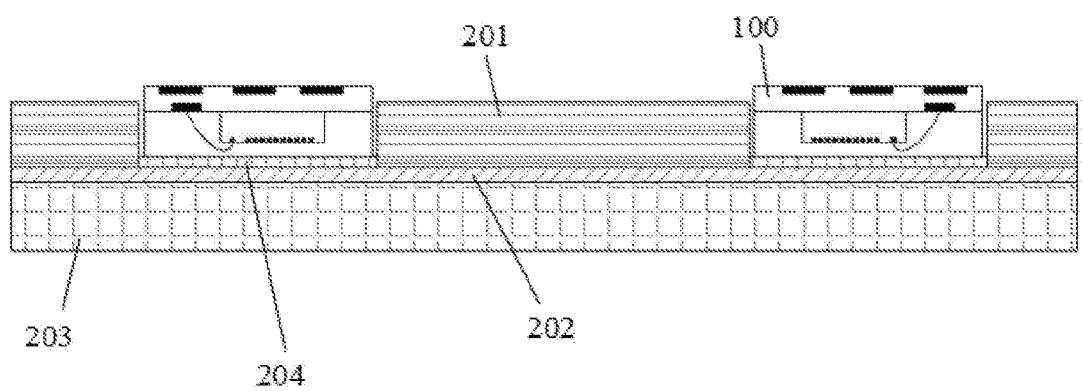
FIG. 11 is a schematic diagram of attaching of the fingerprint identification chip according to an embodiment of the present disclosure.

Referring to FIG. 11, with respect to step S33, in the vacuum environment, when being attached, the fingerprint identification chip 100 may be suitably pressurized and heated, such that the glue layer 204 is solidified, and the bubbles between the fingerprint identification chip 100 and the cover 203 may be greatly eliminated.

Step S4: The board-level module is diced to obtain fingerprint identification modules.

Since the size of the cover 203 may be 8 inches, 12 inches, or bigger, hundreds of hollow areas may be formed at one time on a corresponding board-level module. When the manufacture is performed at a time, a plurality of fingerprint identification modules may be manufactured on the board-level module. After the manufacture, the plurality of fingerprint identification modules on the same board-level module may be diced, such that a plurality of attached fingerprint identification modules may be obtained, which improves the production efficiency, and facilitates large-scale mass production.

The foregoing method for manufacturing the fingerprint identification module is not limited to manufacturing the fingerprint identification module of the present disclosure.

The embodiments provided in the present disclosure create the follow beneficial effects:

1. The fingerprint identification module 200 according to the embodiments of the present disclosure is obtained by dicing a board-level module, and includes a fingerprint identification chip 100, a filling material 201, a color coating 202 and a cover 203. The color coating 202 is disposed between the filling material 201 and the cover 203, and the fingerprint identification chip 100 is inversely attached in a hollow area of the filling material 201 in a vacuum environment. This fingerprint identification module has a simple structure, and is easy to manufacture.

2. The method for manufacturing the fingerprint identification module according to the embodiments of the present disclosure includes: manufacturing a board-level module using a filling material 201, a color coating 202 and a cover 203, and processing an array of hollow areas in a predetermined quantity on the filling material 201 of the board-level module; attaching a fingerprint identification chip 100 into each hollow area in the array of hollow areas of the filling material 201 in a vacuum environment; and dicing the board-level module to obtain a plurality of fingerprint identification modules. The method effectively eliminates bubbles between the fingerprint identification chip 100 and the cover 203, and improves the manufacture efficiency of the fingerprint identification module.

Detailed above are exemplary implementation manners of the present disclosure, but the implementation manners of the present disclosure are not limited by the above embodiments. Any change, modification, replacement, combination, and simplification made within the spirit and principle of present disclosure should be equivalent displacement manners, and shall fall within the protection scope of the present disclosure.

What is claimed is:

1. A fingerprint identification module, wherein the fingerprint identification module is obtained by dicing a board-level module, comprising: a fingerprint identification chip, a filling material, a color coating and a cover;
    wherein the color coating is disposed between the filling material and the cover, and the fingerprint identification chip is inversely attached in a hollow area of the filling material in a vacuum environment;
    wherein the fingerprint identification chip comprises an identification area, an interconnection gold thread, a molding layer, a substrate layer and a pad;
    wherein the identification area is disposed inside of the molding layer, the substrate layer is adhered to the molding layer, the pad is disposed on an upper surface and a lower surface of the substrate layer and is further disposed on an upper surface of the identification area, and the pad on the upper surface of the identification area is connected to the pad on the upper surface of the substrate layer via the interconnection gold thread.

2. The fingerprint identification module according to claim 1, wherein an upper surface of the inversely-attached fingerprint identification chip is above an upper surface of the filling material.

3. The fingerprint identification module according to claim 1, wherein the filling material is an organic colloid, a film or a plastic, and has a photo-induced effect; and
    the hollow area is obtained by exposing and developing a part of the filling material.

4. The fingerprint identification module according to claim 1, wherein the cover is a strip-type glass, a strip-type ceramic, a substrate-type glass, a substrate-type ceramic, or a disc-type glass having the same shape as a wafer.

5. A method for manufacturing a fingerprint identification module, wherein the method comprises:
    manufacturing at least one fingerprint identification chip;
        wherein the fingerprint identification chip comprises an identification area, an interconnection gold thread, a molding layer, a substrate layer and a pad; and
        wherein the identification area is disposed inside of the molding layer, the substrate layer is adhered to the molding layer, the pad is disposed on an upper surface and a lower surface of the substrate layer and is further disposed on an upper surface of the identification area, and the pad on the upper surface of the identification area is connected to the pad on the upper surface of the substrate layer via the interconnection gold thread;
    manufacturing a board-level module comprising a filling material, a color coating and a cover, and processing an array of hollow areas in a predetermined quantity on the filling material of the board-level module;
    attaching a fingerprint identification chip into each hollow area in the array of hollow areas of the filling material in a vacuum environment; and
    dicing the board-level module to obtain fingerprint identification modules.

6. The method according to claim 5, wherein the attaching a fingerprint identification chip into each hollow area in the array of hollow areas of the filling material comprises:
    uniformly filling a glue with a preset thickness at a bottom of each of the hollow areas, and performing a defoaming process to the glue;
    inversely placing the fingerprint identification chip in each hollow area in the array of hollow areas of the filling material; and
    pressurizing the fingerprint identification chip and heating to cure the fingerprint identification chip, such that the fingerprint identification chip is tightly attached to the glue and the glue is solidified.

7. The method according to claim 6, wherein an upper surface of the inversely-placed fingerprint identification chip is above an upper surface of the filling material.

8. The method according to claim 5, wherein the filling material is an organic colloid, a film or a plastic, and has a photo-induced effect; and
    each hollow area in the array of hollow areas of the filling material is obtained by exposing and developing the filling material.

9. The method according to claim 5, wherein the cover is a strip-type glass, a strip-type ceramic, a substrate-type glass, a substrate-type ceramic, or a disc-type glass having the same shape as a wafer.

\* \* \* \* \*